United States Patent
Ang

(10) Patent No.: US 7,579,271 B2
(45) Date of Patent: Aug. 25, 2009

(54) METHOD FOR FORMING LOW DIELECTRIC CONSTANT FLUORINE-DOPED LAYERS

(75) Inventor: Ting Cheong Ang, Beijing (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 89 days.

(21) Appl. No.: 11/418,501

(22) Filed: May 3, 2006

(65) Prior Publication Data

US 2007/0190769 A1 Aug. 16, 2007

(30) Foreign Application Priority Data

Feb. 16, 2006 (CN) .................... 2006 1 0023915

(51) Int. Cl.
H01L 21/4763 (2006.01)
(52) U.S. Cl. .................... 438/637; 438/631; 438/687; 438/784; 438/786; 438/787; 257/E21.273; 257/E21.276; 257/E21.573; 257/E21.576; 257/E21.586
(58) Field of Classification Search ............ 438/622, 438/618, 631, 637, 675, 687, 784, 786, 787, 438/794; 257/E21.273, 276, 576, 586
See application file for complete search history.

(56) References Cited

U.S. PATENT DOCUMENTS

| | | | |
|---|---|---|---|
| 6,319,858 B1 * | 11/2001 | Lee et al. | 438/787 |
| 2002/0173172 A1 * | 11/2002 | Loboda et al. | 438/786 |
| 2004/0067634 A1 * | 4/2004 | Kim et al. | 438/622 |
| 2005/0098856 A1 * | 5/2005 | Aronowitz et al. | 257/632 |
| 2005/0200021 A1 * | 9/2005 | Ito et al. | 257/758 |
| 2006/0084279 A1 * | 4/2006 | Chang et al. | 438/778 |
| 2006/0276030 A1 * | 12/2006 | Wang et al. | 438/631 |
| 2007/0299239 A1 * | 12/2007 | Weigel et al. | 528/349 |

* cited by examiner

*Primary Examiner*—Michael S Lebentritt
(74) *Attorney, Agent, or Firm*—Townsend and Townsend and Crew LLP

(57) ABSTRACT

A method for forming a semiconductor device is provided. In one embodiment, the method includes providing a semiconductor substrate with a surface region. The surface region includes one or more layers overlying the semiconductor substrate. In addition, the method includes depositing a dielectric layer overlying the surface region. The dielectric layer is formed by a CVD process. Furthermore, the method includes forming a diffusion barrier layer overlying the dielectric layer. In addition, the method includes forming a conductive layer overlying the diffusion barrier layer. Additionally, the method includes reducing the thickness of the conductive layer using a chemical-mechanical polishing process. The CVD process utilizes fluorine as a reactant to form the dielectric layer. In addition, the dielectric layer is associated with a dielectric constant equal or less than 3.3.

11 Claims, 11 Drawing Sheets

METHOD FOR FORMING LOW DIELECTRIC CONSTANT FLUORINE-DOPED LAYERS

CROSS-REFERENCES TO RELATED APPLICATIONS

This application claims priority to Chinese Patent Application No. 200610023915.X, filed Feb. 16, 2006, commonly assigned, incorporated by reference herein for all purposes.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

The present invention is directed to integrated circuits and their processing for the manufacture of semiconductor devices. More particularly, the invention provides a method for improving the mechanical strength of low dielectric constant layers. But it would be recognized that the invention has a much broader range of applicability. Certain embodiments of the invention can be applied to microprocessor devices, memory devices, application specific integrated circuit devices, as well as various other interconnect structures.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. However, one significant problem that occurs with shrinking figure sizes on an IC is that the conducting portions of an IC such as wire interconnects and transistors often need to be placed closer and closer together, and the insulating dielectrics used to separate the conducting portions also become thinner to accommodate for the reduced size between conducting portions. However, as the transistors are placed in greater proximity to each other, problems in cross-talk noise, power dissipation, RC delay and others can occur.

One design choice that can help alleviate the problems described above as a result of more tightly packed IC layouts is the use of low dielectric constant dielectrics between the conducting portions of the IC. For example, low dielectric constant dielectrics may have a k-value or dielectric constant of below 3.5. Their use can result in lower parasitic capacitance and enable faster switching speeds and lower heat dissipation within the IC. However, the incorporation of low dielectric constant dielectric materials into IC chips can result in integration difficulties not previously foreseen.

From the above, it can be seen that an improved technique for processing semiconductor devices is desired.

BRIEF SUMMARY OF THE INVENTION

The present invention is directed to integrated circuits and their processing for the manufacture of semiconductor devices. More particularly, the invention provides a method for improving the mechanical strength of low dielectric constant layers. But it would be recognized that the invention has a much broader range of applicability. Certain embodiments of the invention can be applied to microprocessor devices, memory devices, application specific integrated circuit devices, as well as various other interconnect structures.

In an embodiment of the invention, a method for forming a semiconductor device is provided. The method includes providing a semiconductor substrate with a surface region. The surface region includes one or more layers overlying the semiconductor substrate. In addition, the method includes depositing a dielectric layer overlying the surface region. The dielectric layer is formed by a CVD process. Furthermore, the method includes forming a diffusion barrier layer overlying the dielectric layer. In addition, the method includes forming a conductive layer overlying the diffusion barrier layer. Additionally, the method includes reducing the thickness of the conductive layer using a chemical-mechanical polishing process. The CVD process utilizes fluorine as a reactant to form the dielectric layer. In addition, the dielectric layer is associated with a dielectric constant equal or less than 3.3.

In another embodiment of the invention, a method for forming a dielectric layer is provided. The method includes providing a-semiconductor substrate with a surface region. The surface region includes one or more layers overlying the semiconductor substrate. The method additionally includes introducing the semiconductor substrate into a processing chamber. Furthermore, the method includes introducing the semiconductor substrate into a processing chamber. In addition, the method includes providing one or more precursors into the processing chamber. At least one of the one or more precursors includes fluorine. The method also includes forming a plasma within the processing chamber. The plasma causes a chemical reaction using the one or more precursors on the surface region of the semiconductor substrate. The method additionally includes removing the semiconductor substrate from the processing chamber. The chemical reaction causes the formation of a dielectric layer on the surface region of the semiconductor substrate. In addition, the dielectric layer is associated with a dielectric constant equal or less than 3.3.

In another embodiment of the invention, a method for forming a SiOCF layer is provided. The method includes providing a semiconductor substrate with a surface region. The surface region includes one or more layers overlying the semiconductor substrate. The method additionally includes introducing the semiconductor substrate into a processing chamber. Furthermore, the method includes introducing the semiconductor substrate into a processing chamber. In addition, the method includes providing one or more precursors into the processing chamber. At least one of the one or more precursors includes fluorine. The method also includes forming a plasma within the processing chamber. The plasma causes a chemical reaction using the one or more precursors on the surface region of the semiconductor substrate. The method additionally includes removing the semiconductor substrate from the processing chamber. The chemical reaction causes the formation of a SiOCF layer on the surface region of the semiconductor substrate. In addition, the SiOCF layer is associated with a dielectric constant equal or less than 3.3.

Many benefits are achieved by way of the present invention over conventional techniques. For example, the present technique provides an easy to use process that relies upon conventional technology. In some embodiments, an effective method of forming a low dielectric constant layer is provided whereby the mechanical strength of the layer can be improved while maintaining the same dielectric constant. This can improve the device reliability and performance of the semiconductor circuit being formed by providing superior electrical isolation. In some embodiments, the addition of fluorine results in a fluorine-containing carbon-doped layer with a low dielectric constant and improved mechanical and electrical properties. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1:
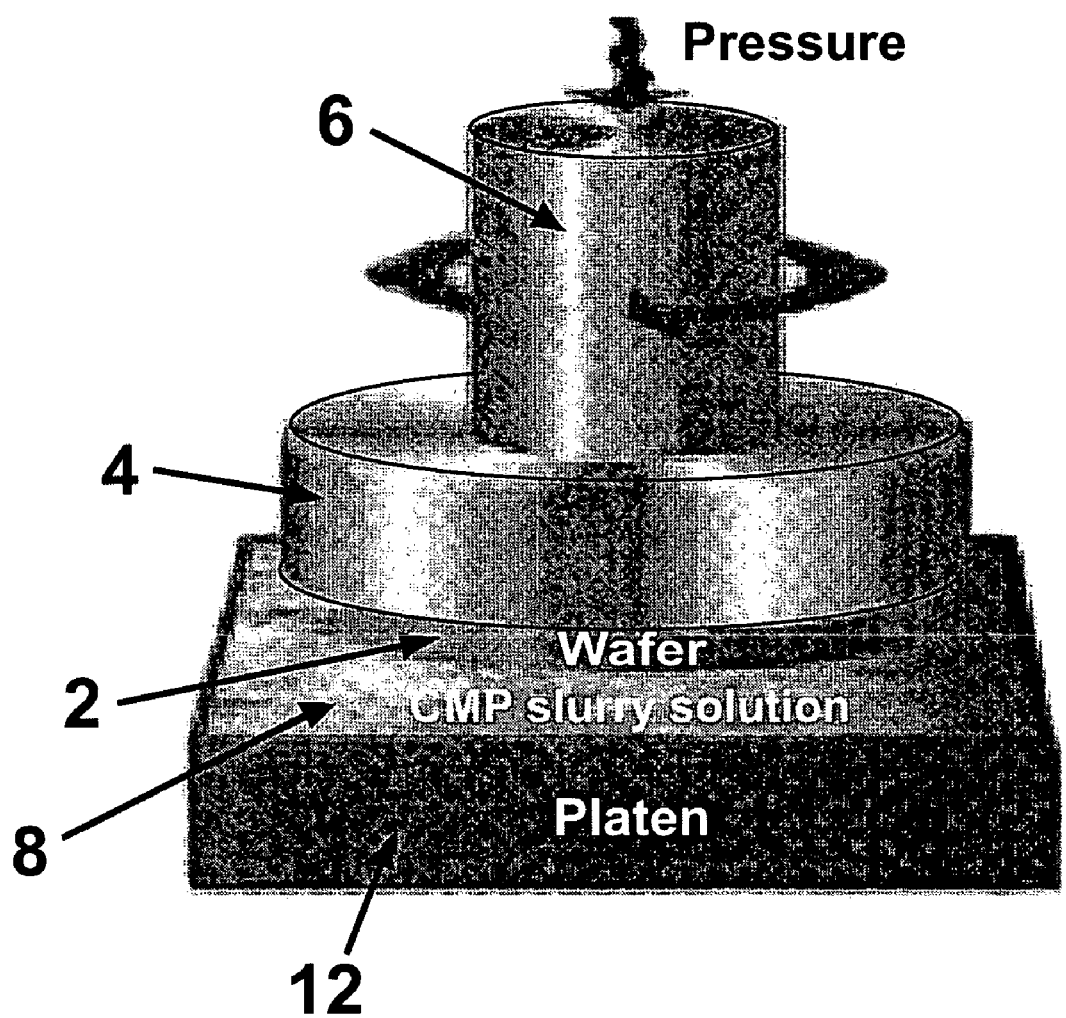
FIG. 1 is a simplified conventional diagram illustrating the operation of a chemical-mechanical polishing (CMP) device used to planarize layers formed on a substrate.

The present invention is directed to integrated circuits and their processing for the manufacture of semiconductor devices. More particularly, the invention provides a method for improving the mechanical strength of low dielectric constant layers. But it would be recognized that the invention has a much broader range of applicability. Certain embodiments of the invention can be applied to microprocessor devices, memory devices, application specific integrated circuit devices, as well as various other interconnect structures.

When low dielectric constant layers are used as dielectric insulators within semiconductor devices, they can provide a lower k-value, or a lower dielectric constant than certain conventional insulation materials. This can lead to reduced amounts of parasitic capacitance and an increased switching speed of the device being formed. However, low dielectric constant materials also tend to be porous and less dense in comparison to high-k dielectrics, which can lead to a reduced mechanical strength. A tradeoff between the electrical and physical properties of the low dielectric constant material must often be made for successful inclusion of the low dielectric constant material into the layers within an integrated circuit. One result of this is that low dielectric constant layers are significantly 'softer' than conventional inter-metal dielectric layers. General 'softness' of the layers can be determined by measuring the hardness and modulus, both physical characteristics of the deposited layer. For example, hardness is a measure of the material expressing its resistance to physical deformation. The modulus of a material, or Young's Modulus, is a measure of the stiffness of a material that is equal to the ratio of stress to strain before the material yields to ductile deformation. One difference between the hardness and the modulus of a material is that hardness measures permanent physical deformation, while the modulus measures the stiffness and elastic deformation of the layer. Combined together, they provide a measure of the mechanical strength of deposited low dielectric constant layers.

While the materials on a semiconductor substrate have been referred to within this document as layers, they could additionally be referred to as films. The intended usage of these terms is meant to be interchangeable and should not impact their meaning.

Table 1 shows modulus and hardness values for a variety of low dielectric constant layers, including Aurora 2.85, Black Diamond, Coral, and SiLK. Fluorosilicate glass (FSG) is included as a representative high-k layer to additionally illustrate the differences in physical characteristics between low dielectric constant layers and high-k layers. FSG can also be referred to as SiOF. As a high-k material, FSG possesses a dielectric constant of around 3.6. For example, a FSG layer can be deposited using a PECVD process whereby a Si—F species introduced using $SiF_4$ as a precursor within FSG. The Si—F species is effective at lowering the dielectric value of the layer due to the low polarizability of the Si—F bond. Alternatively, $C_2F_6$ can also be used as a precursor for the formation of FSG layers. However, the addition of increased amounts of fluorine can lead to stability issues within FSG layers.

TABLE 1

Modulus and Hardness Values for Low-k films

| Film | Aurora 2.85 | Black Diamond | Coral | SiLK | FSG |
|---|---|---|---|---|---|
| Modulus (GPa) | 12 | 9 | 8.6 | 2.7 | 90 |
| Hardness (GPa) | 2 | 1.5 | 1.45 | 0.16 | 12 |

The dielectric layers exhibited a modulus of between 2.7 and 12 GPa, while the FSG layer exhibited a modulus of 90 GPa. The hardness values for the low dielectric constant layers were between 0.16 and 2 GPa while the hardness of the FSG layer was 12 GPa. It can be seen from the relative hardness and modulus values that low dielectric constant layers exhibit a significantly reduced mechanical strength when compared against high-k layers.

One additional example of a low dielectric constant layer is SiOC, or carbon-doped oxide. The k-value of SiOC can be reduced by introducing non-polar species such as carbon to the existing Si—O network. However, this results in significantly reduced mechanical strength, which can cause problems with delamination as detailed below. SiOC can be formed using a PECVD process.

One consequence of the reduced mechanical strength of low dielectric constant layers is that it leads to lower cohesive strength and weak adhesion properties for the low dielectric constant layer. This makes it more difficult to integrate low dielectric constant layers into semiconductor structures, especially when multiple interconnect layers are needed to obtain optimum device performance. Weak adhesion properties can lead to delamination problems with adjacent layers when stresses are exerted on the wafer. For example, wafer sawing or scribing, chip-to-package assembly, thermal stress, chemical-mechanical polishing (CMP), and other processes can exert stress on and cause delamination of the wafer. Delamination is a disconnect or crack between two layers in a silicon stack, which can result in voiding between the layers. While these cracks pose significant problems during their initial formation, they can create even greater problems later during the preparation of a wafer when the interface adjoining the crack is pulled apart by process or packaging induced forces.

One such example of a process which can exert forces upon a wafer that can lead to delamination is a chemical-mechanical polishing (CMP) process used to planarize the top surface of a partly-processed wafer or substrate. FIG. 1 is a simplified conventional diagram illustrating the operation of a chemical-mechanical polishing (CMP) device used to planarize layers formed on a substrate. The CMP process uses an abrasive polishing pad (not shown, covered by slurry 8 mounted on a rotating platen 12 several times larger than the wafer 2. An abrasive, corrosive liquid slurry 8 is distributed over the polishing pad to physically grind or planarize the microscopic topographic features on a partially processed wafer 2 so that subsequent processes can begin from a flat surface. The back surface of wafer 2 is mounted to a polishing head 4 and held in place by a retaining ring (not shown) so the front surface of the wafer is exposed to abrasive slurry 8. Polishing head 4 is rotated at different rates in a circular range of motion to even out any irregular topography which may exist on wafer 2. Additionally, a downwards pressure is exerted through shaft 6 which presses wafer 2 down against the abrasive slurry 8 located on the polishing pad. Abrasive slurry 8 also chemically reacts and weakens the material being removed, thus accelerating the rate of removal. The polishing pad further serves to wipe away the removed material, preventing it from being lodged on the surface of wafer 2.

Figure 2:
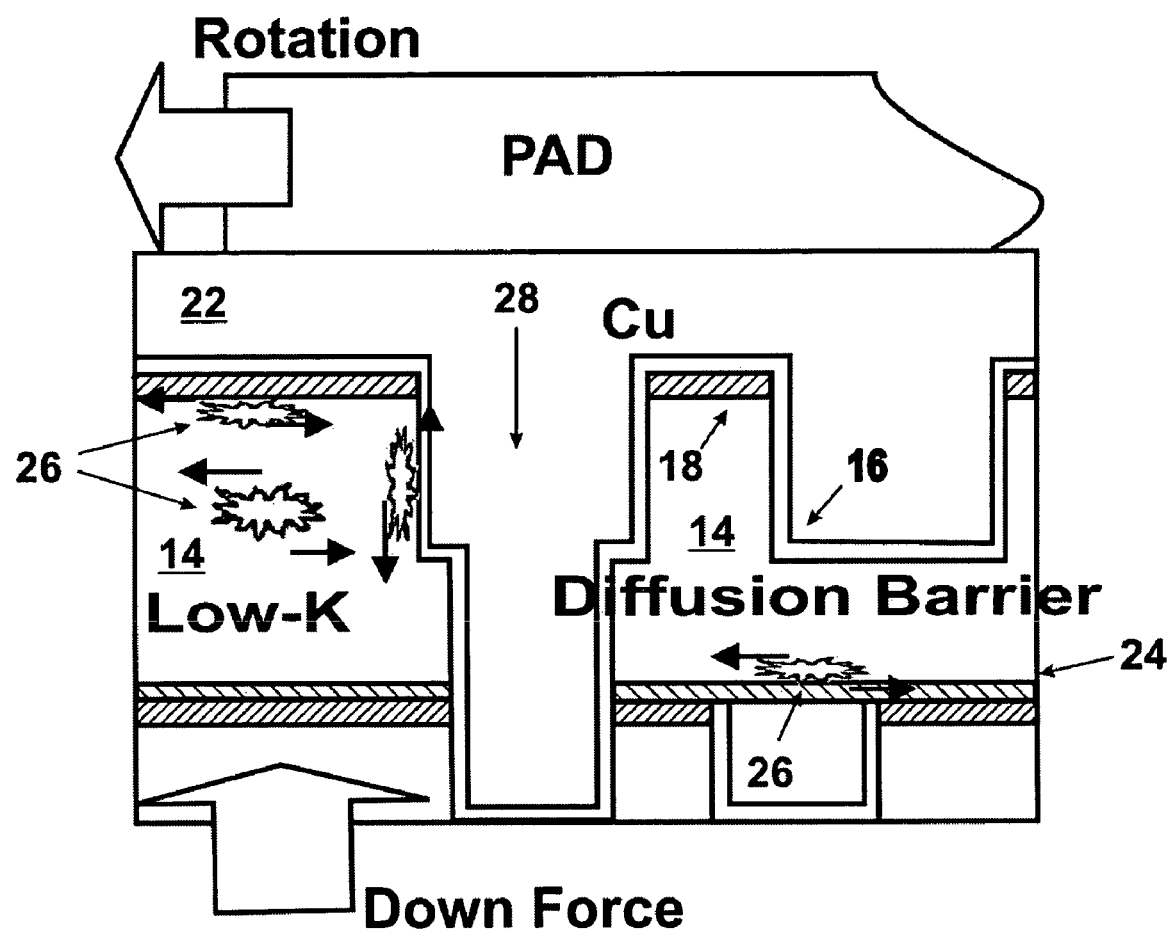
FIG. 2 is a simplified exemplary diagram of an substrate interconnect layout and potential delamination problems.

The combination of downwards force and rotational movement by polishing head 4 attached to wafer 2 aids in the removal of excess material on the surface of wafer 2. However, these forces can also lead to delamination between adjacent layers on a silicon stack formed on wafer 2, as shown in FIG. 2. FIG. 2 is a simplified exemplary diagram of an substrate interconnect layout and potential delamination problems. This diagram is merely an example, which should not unduly limit the scope of the claims herein. One of ordinary skill in the art would recognize many variations, modifications, and alternatives.

Low dielectric constant layer 14 is deposited and etched to form a trench 28 within the low dielectric constant layer 14. A dual-damascene or single damascene process may be used to create trench 28 as shown within FIG. 2. Diffusion barrier layer 16 covers the top and side surfaces of low dielectric constant layer 14 extending into trench 28. For example, diffusion barrier layer 16 may comprise silicon carbide, silicon nitride, titanium nitride, tungsten-carbon-nitride, aluminum nitride, tantalum nitride, or other suitable barrier materials. Diffusion barrier layer 16 is used to prevent the diffusion of copper ions in copper layer 22 from diffusing into low dielectric constant layer 14 and affecting its electrical properties. A cap layer 18 may be present at the interface between the diffusion barrier layer 16/copper layer 22 and the low dielectric constant layer 14 because copper can often corrode or degrade adjacent materials and can adhere poorly to low dielectric constant layer 14 below. However, when a downwards force and rotational movement is applied to a partly-processed wafer, delamination can occur at delamination regions 26 because of poor adhesion strength between the low dielectric constant layer 14 and diffusion barrier layer 16. The down force as shown in FIG. 2 is shown as being oriented in an upwards direction, as the backside of the wafer is attached to the polishing head and the topmost layer on the wafer is in contact with the abrasive slurry and planarized to a desired thickness. Delamination can occur in both a horizontal direction between cap layer 18 or diffusion barrier layer 16 and low dielectric constant layer 14, or between the diffusion barrier layer 16 and low dielectric constant layer 14 in a vertical direction. As multiple copper interconnect layers may be present within a silicon stack, delamination between the low dielectric constant layers and diffusion barrier layers is greatly exacerbated when multiple CMP processes are employed within the processing of the wafer. However, it is noted that processes other than a CMP process could also cause delamination between different layers within the silicon stack. Of course, there can be other variations, modifications, and alternatives.

Figure 3:
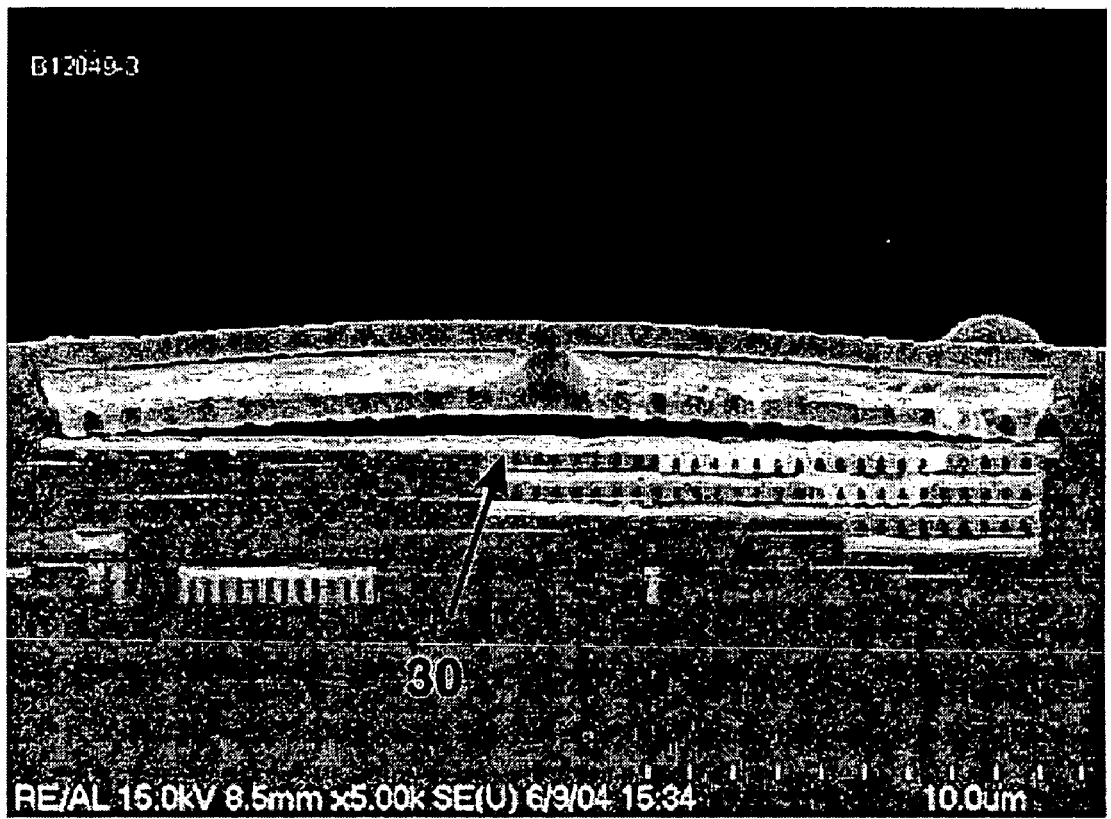
FIG. 3 is a scanning electron microscope (SEM) image of a cross-section of a semiconductor substrate showing delamination.

FIG. 3 is a scanning electron microscope (SEM) image of a cross-section of a semiconductor substrate showing delamination. Delaminated area 30 can be clearly seen as a void that occurs in between layers within the silicon stack. In this specific instance, the delamination has occurred in a horizontal interface between the two layers as a result of the downwards and rotational forces exerted by a CMP process. Voiding can cause severe performance issues by increasing leakage currents, impairing device performance, and decreasing electrical reliability of the circuits being formed.

Due to problems with the mechanical strength of existing dielectric layers, a formation process could be used to deposit a low dielectric constant layer that possesses increased mechanical strength as well as a reduced dielectric constant. By achieving a balance between lowering the dielectric constant and maximizing the mechanical strength of the layer, a more usable dielectric layer could be developed. An example of such a low dielectric constant layer is SiOCF or OFSG (organofluorosilicate glass).

Figure 4:
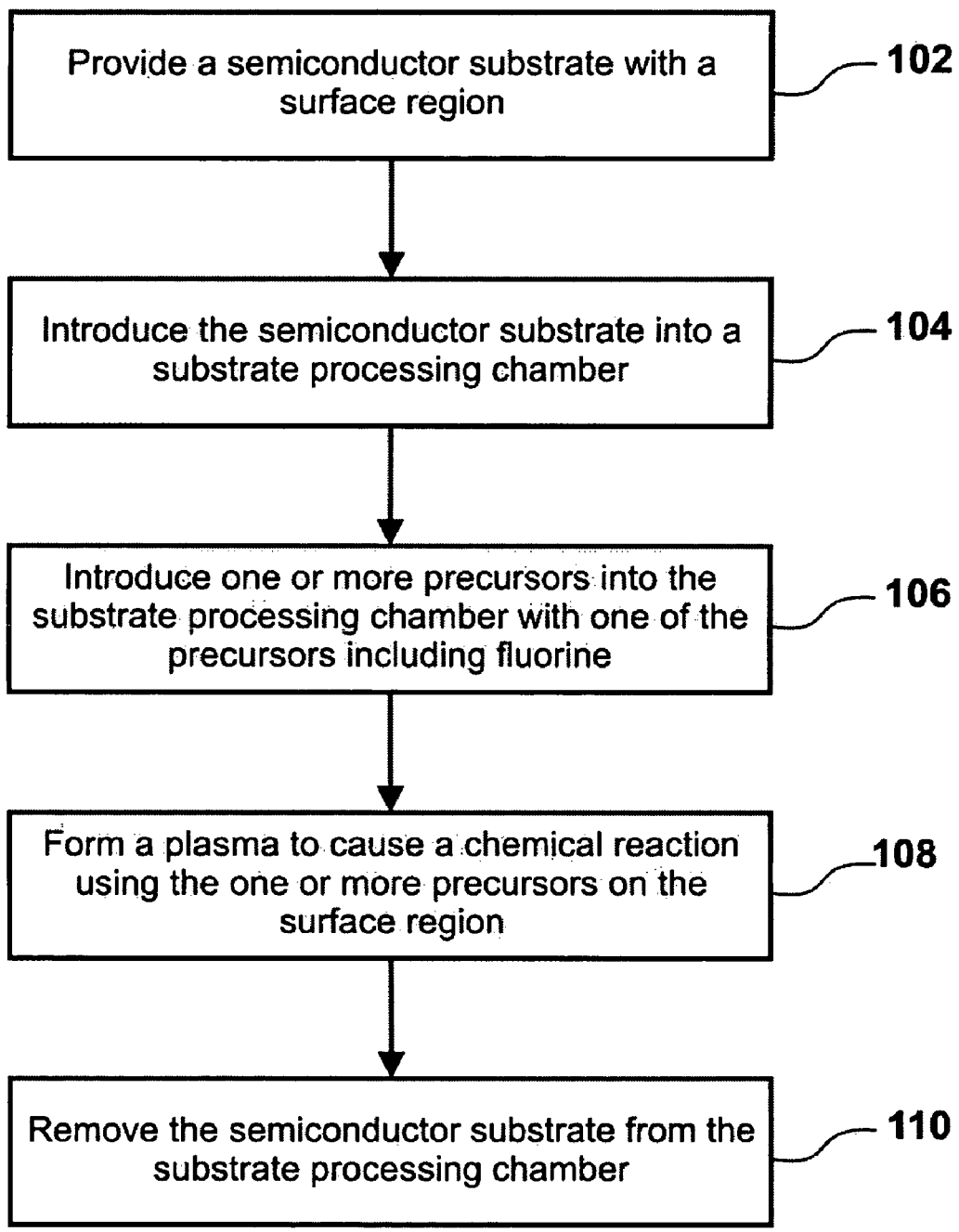
FIG. 4 is an exemplary simplified process flow showing the deposition of a low dielectric constant layer with improved mechanical properties according to an embodiment of the present invention.

FIG. 4 is an exemplary simplified process flow showing the deposition of a low dielectric constant layer with improved mechanical properties according to an embodiment of the present invention. Process flow 100 includes process 102 for providing a semiconductor substrate with a surface region, process 104 for introducing the semiconductor substrate into a substrate processing chamber, process 106 for introducing one or more precursors into the processing chamber with one of the precursors including fluorine, process 108 for forming a plasma to cause a chemical reaction using the one or more precursors on the surface region, and process 110 for removing the semiconductor substrate from the processing chamber. This diagram is merely an example, which should not unduly limit the scope of the claims herein. One of ordinary skill in the art would recognize many other variations, modifications, and alternatives.

In process 102, a semiconductor substrate with a surface region is provided. The surface region may comprise one or more layers overlying the semiconductor substrate, and may additionally comprise one or more dielectric and/or copper layers. For example, the surface region may also comprise a single or dual damascene interconnect. In process 104, the semiconductor substrate is then introduced into a semiconductor processing chamber. For example, the semiconductor processing chamber may be a CVD, PECVD, HDP-CVD chamber, or other processing environment capable of depositing a dielectric layer. Of course, there can be other variations, modifications, and alternatives.

In process 106, one or more precursors is introduced onto the surface region within the substrate processing chamber. For example, the precursor may be selected from the group consisting of DMDMOS, 3MS, TOMCAT, $O_2$, $N_2O$, $H_2O_2$, and OMCAT but other precursors could also be used. Fluorine may be introduced by using $SiF_4$, but other fluorine-containing precursors may also be used. However, at least one of the precursors must include fluorine. A plasma is formed in process 108 within the semiconductor processing chamber to create a chemical reaction using the one or more precursors on the surface region. The chemical reaction causes the formation of the dielectric layer on the surface region of the semiconductor substrate. In addition, the dielectric layer may possess a dielectric constant equal or less than 3.3. The deposition process may be performed at the following process conditions: a temperature between and inclusive of 300-400 degrees C., at a pressure between and inclusive of 1-10 Torr, and at an RF power between and inclusive of 20-500 Watts. For example, an exemplary gas flow ratio of 10:5:3 of 3MS:$SiF_4$:$O_2$ can be utilized to form a layer of SiOCF as the dielectric layer. In addition, the leakage current of the deposited layer may be lower than that of a comparable layer formed without the addition of fluorine. Of course, there can be other variations, modifications, and alternatives.

Following the deposition process, the semiconductor substrate can be removed from the semiconductor processing chamber in process 110.

Figure 5:
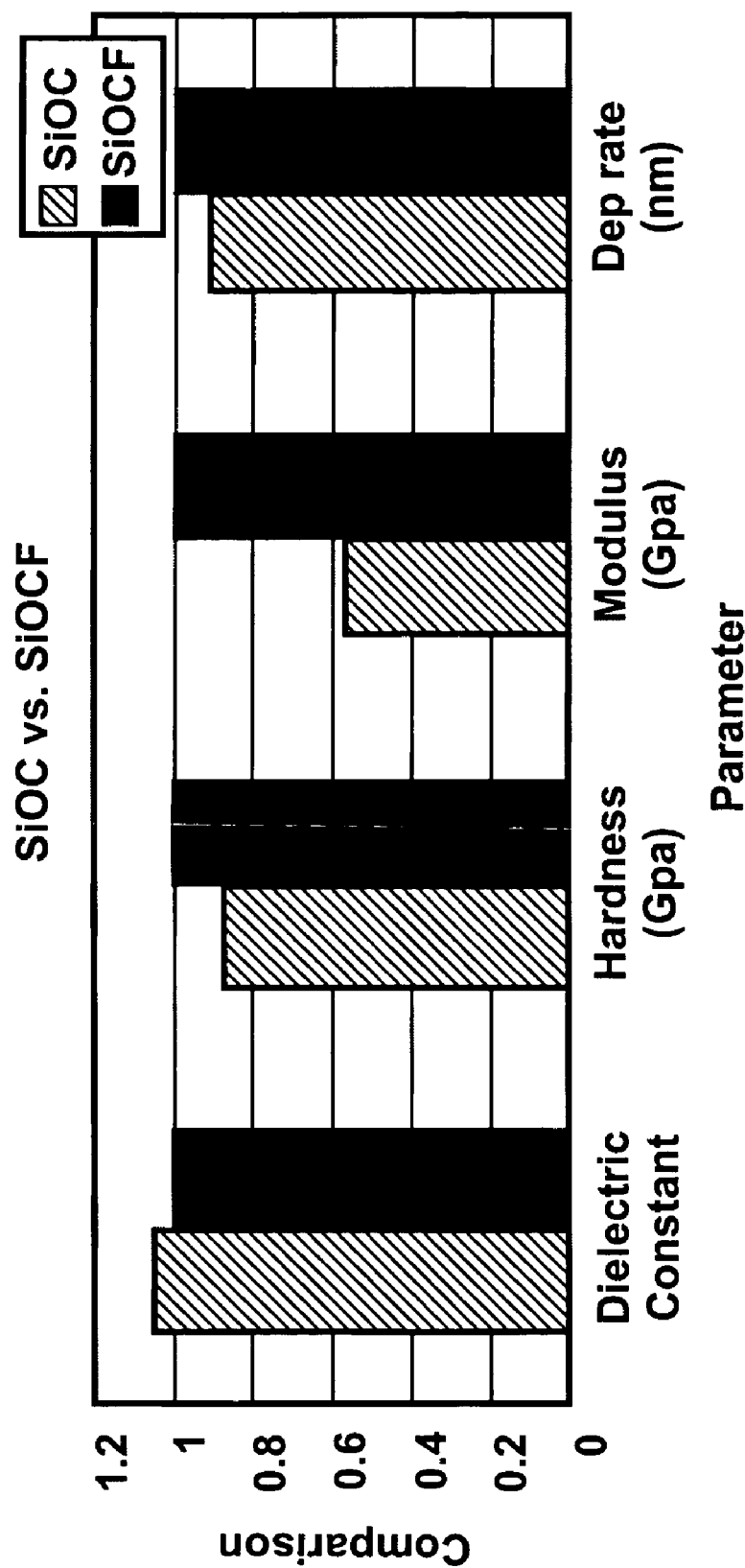
FIG. 5 is an exemplary chart showing a comparison between different physical and electrical parameters between SiOC and SiOCF according to an embodiment of the present invention.

A comparison of the properties of SiOC and SiOCF can be seen in Table 2. Additionally, FIG. 5 is an exemplary chart showing a comparison between different physical and electrical properties between SiOC and SiOCF according to an embodiment of the present invention. Within FIG. 5, a comparison is made based on the difference in relative values between a variety of parameters for SiOC and SiOCF.

TABLE 2

Comparison of Properties of SiOC and SiOCF

| Material | SiOC | SiOCF |
|---|---|---|
| Dielectric constant | 3.3 | 3.15 |
| Hardness (GPa) | 1.75 | 2 |
| Modulus (GPa) | 12 | 21 |
| Dep rate (nm) | 550 | 600 |
| Leakage curent | 2.00E−07 | 3.00E−08 |

While the molecular structure of SiOC and SiOCF share similar components, the addition of fluorine to create SiOCF has created many improved physical properties, maintaining its viability as a low dielectric constant material. The dielectric constant of SiOCF is lower than that of SiOC, allowing it to be used in dielectric applications requiring a reduced dielectric constant. In addition, the hardness and modulus values for SiOCF are greater than those of SiOC. The increased mechanical strength can allow for increased adhesive properties and a reduced amount of delamination occurring within the manufacturing process. In addition, the deposition rate of SiOC and SiOCF are similar to each other, allowing for integration into existing process flows without substantial modification. Finally, the leakage current of SiOCF is lower than that of SiOC.

Figure 6:
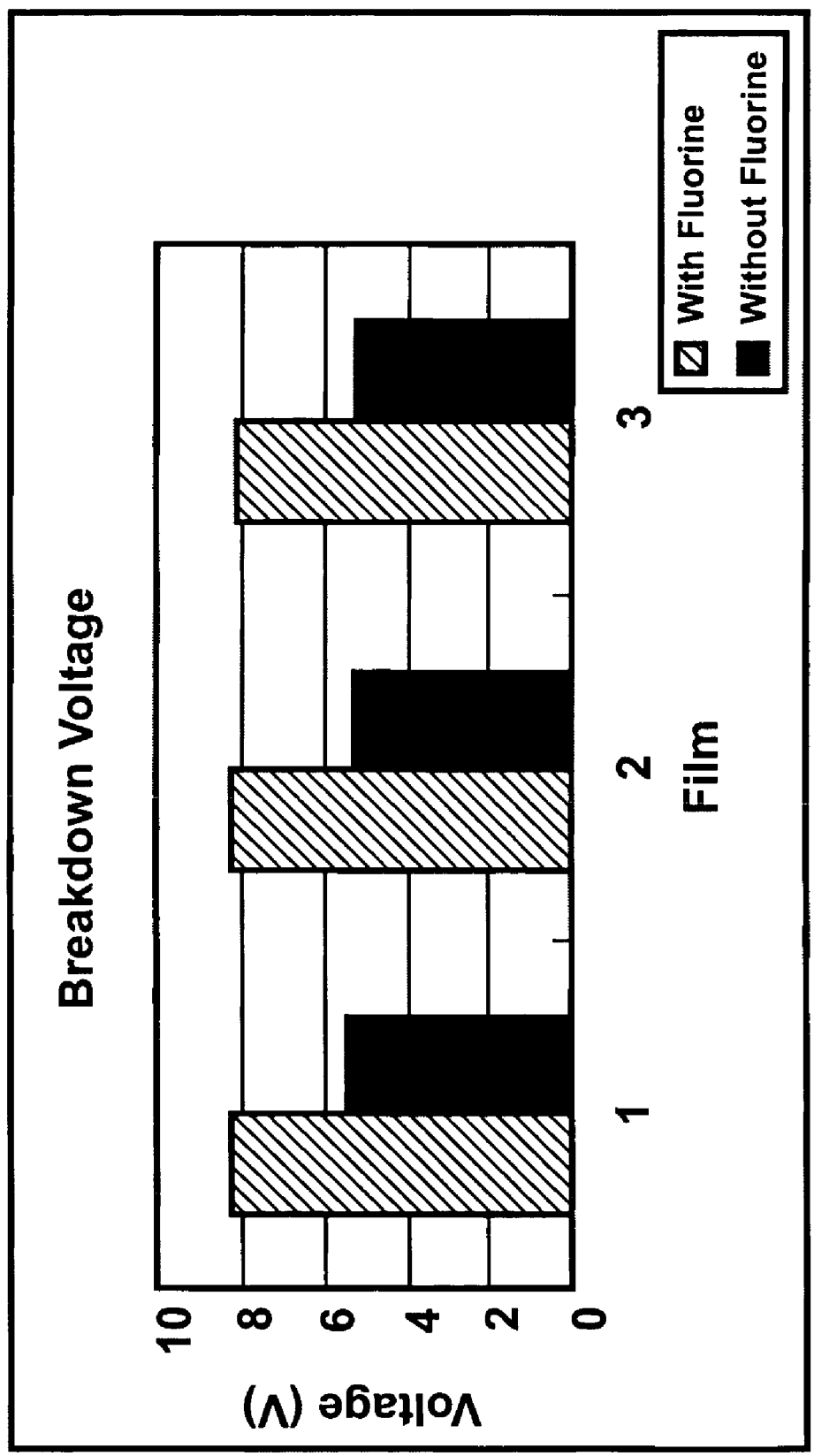
FIG. 6 is an exemplary chart showing a comparison of the breakdown voltage between for layers containing fluorine and without fluorine according to an embodiment of the present invention.

FIG. 6 is an exemplary chart showing a comparison of the breakdown voltage between for layers containing fluorine and without fluorine according to an embodiment of the present invention. For example, the fluorine-containing layer could be SiOCF and the layer without fluorine could be SiOC. The layer containing fluorine displays a higher breakdown voltage than that of the layer without fluorine. This allows for a more robust dielectric material that can withstand a greater amount of voltage before breakdown begins. Of course, there can be other variations, modifications, and alternatives.

Figure 7:
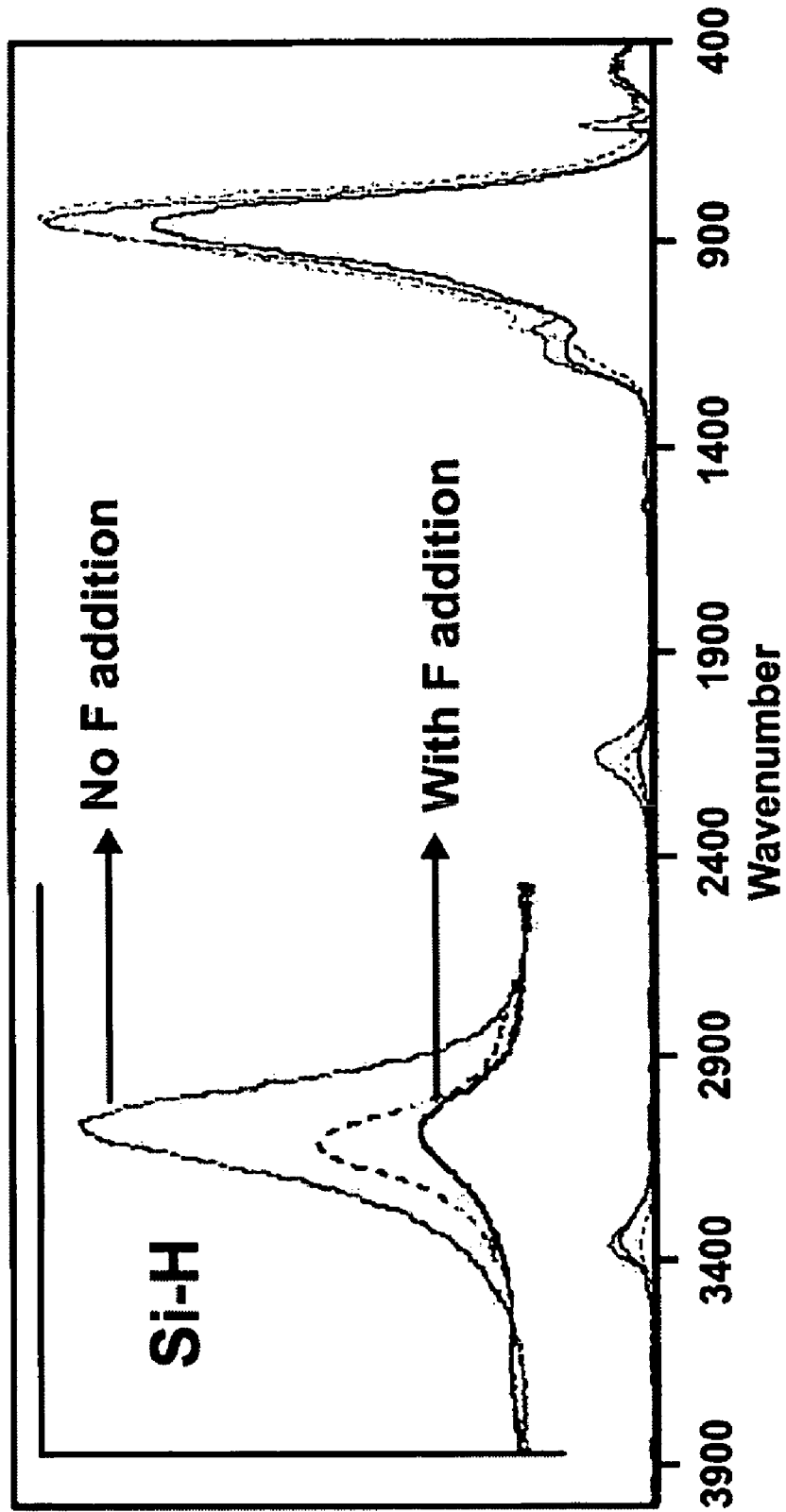
FIG. 7 is an exemplary chart showing spectroscopy results from different wafers according to an embodiment of the present invention.

According to an embodiment of the present invention, the inventor has theorized that the higher mechanical strength of the OSFG layer is due to the fact that OFSG possesses a higher density as compared against SiOC. In addition, the Si—F bonds may occupy less volume than the Si—$CH_3$ bonds present within SiOC. FIG. 7 is an exemplary chart showing spectroscopy results from different wafers according to an embodiment of the present invention. The occurrence of Si—H bonds are much less prevalent with the addition of fluorine than without. The inventor has additionally theorized that a reduced amount of SiH seen within the SiOCF can be attributed to the presence of the fluorine radicals acting as hydrogen scavengers, thus resulting in weaker Si—H bonds. The more weakly bound and chemically susceptible organic species can be replaced with the higher-density Si—F groups. This can also lead to superior thermal stability of SiOCF in comparison to SiOC. Of course, there can be other variations, modifications, and alternatives.

The improved electrical properties of SiOCF in comparison with SiOC can also be attributed to the fact that fluorine is less polarizable than carbon. For example, there are two microscopic mechanisms of polarizations in dielectric materials. Electronic polarization refers to the displacement of the cloud of bound electrons with reference to the nucleus of an atom under an applied electric field. A second mechanism is distortion or ionic polarization, whereby the position of the nuclei is distorted or moved slightly due to the applied field, thereby stretching or compressing the bond length. The addition of fluorine lowers the electrical polarizability of SiOCF, with no degradation in the layer mechanical strength. In addition, the network structure of the dielectric material can be changed by introducing terminal groups such as Fluorine or $CH_3$ which cannot form additional networks. Of course, there can be other variations, modifications, and alternatives.

Figure 8:
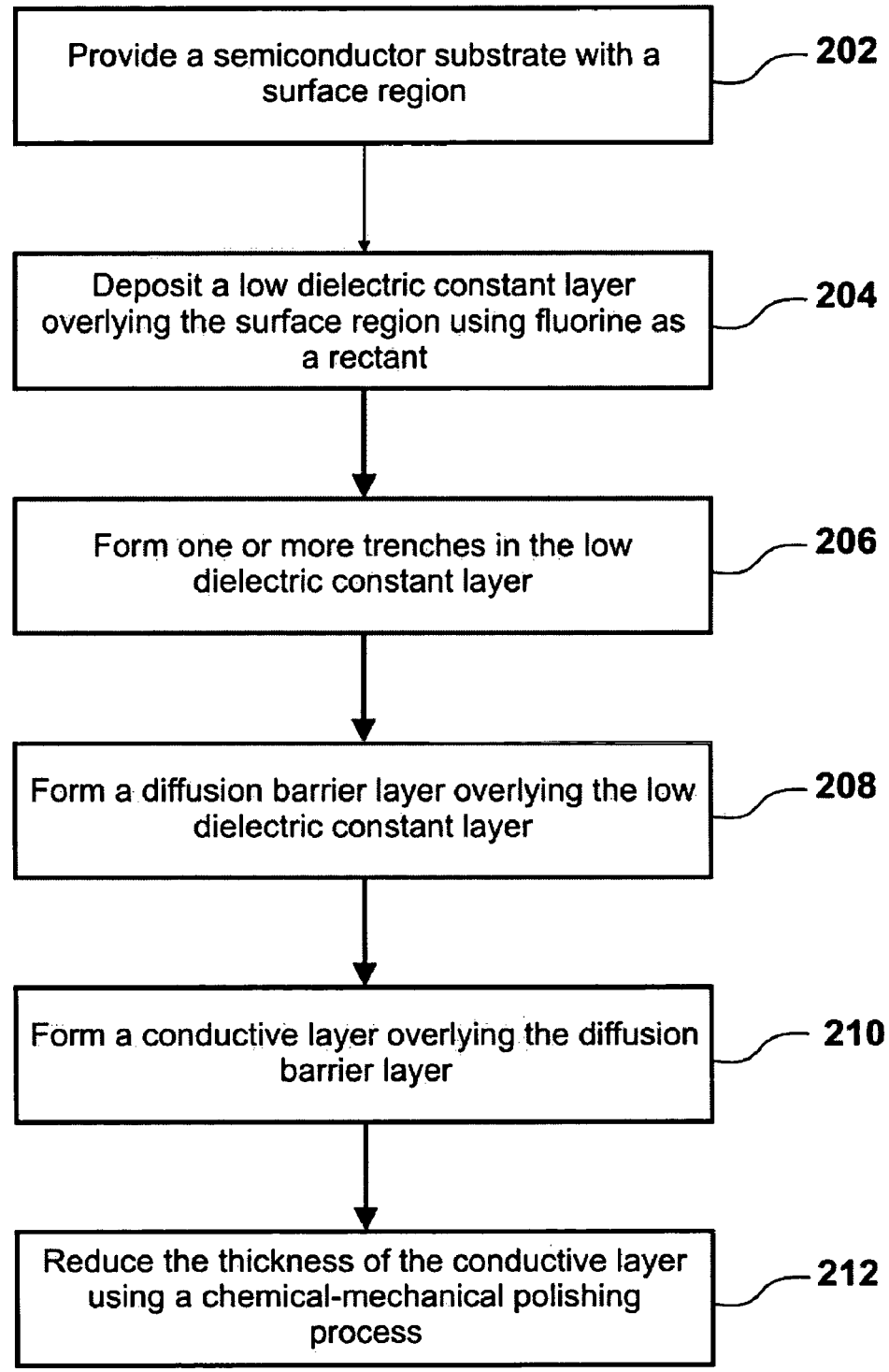
FIG. 8 is an exemplary simplified process flow showing the formation of a semiconductor device including a low dielectric constant layer with improved mechanical properties according to an embodiment of the present invention.

FIG. 8 is an exemplary simplified process flow showing the formation of a semiconductor device including a low dielectric constant layer with improved mechanical properties according to an embodiment of the present invention. For example, the low dielectric constant layer may be SiOCF. The process flow 200 includes process 202 for providing a semiconductor substrate with a surface region, process 204 for depositing a low dielectric constant layer overlying the surface region while using fluorine as a reactant, process 206 for forming one or more trenches in the low dielectric constant layer, process 208 for forming a diffusion barrier layer overlying the low dielectric constant layer, process 210 for forming a conductive layer overlying the diffusion barrier layer, and process 212 for reducing the thickness of the conductive layer using a chemical-mechanical polishing process. FIG. 8 may also be better understood in regards to FIGS. 9A-9E which are exemplary diagrams showing the formation of a semiconductor device that includes a low dielectric constant layer according to an embodiment of the present invention. These diagrams are merely examples, which should not unduly limit the scope of the claims herein. One of ordinary skill in the art would recognize many other variations, modifications, and alternatives.

Figure 9A:
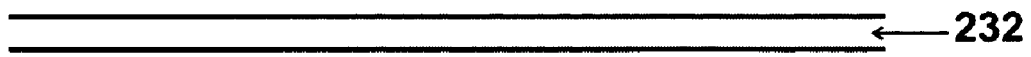
FIGS. 9A-9F are exemplary diagrams showing the formation of a semiconductor device that includes a low dielectric constant layer according to an embodiment of the present invention.

In process 202, a semiconductor substrate 230 with a surface region 232 is provided in structure 214 as shown in FIG. 9A. Surface region 232 may comprise one or more layers overlying semiconductor substrate 230. Surface region 232 may additionally comprise one or more dielectric and/or conductive layers. For example, surface region 232 may also comprise a single or dual damascene interconnect formed in one or more dielectric layers.

Figure 9B:
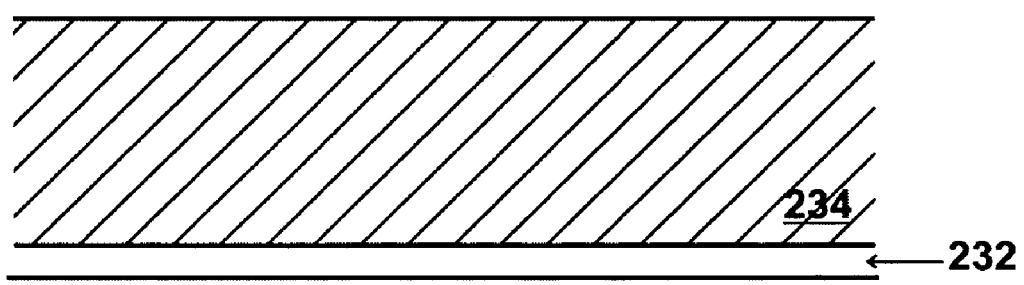

In process 204, a low dielectric constant layer 234 is deposited overlying surface region 232 in structure 216 as shown in FIG. 9B. Low dielectric constant layer 234 can be deposited upon the surface region overlying the semiconductor substrate using a PECVD process, but other deposition processes could also be used. For example, the deposition process may be performed at the following process conditions: a temperature between and inclusive of 300-400 degrees C., at a pressure between and inclusive of 1-10 Torr, and at an RF power between and inclusive of 20-500 Watts. In addition, the deposition process can be performed while fluorine is introduced into the processing environment to react with low dielectric constant layer 234. Fluorine may be introduced by using $SiF_4$, but other fluorine-containing gases may also be used. In a specific embodiment of the invention, the low dielectric constant layer may be SiOCF. For example, SiOCF exhibits increased mechanical strength and a similar dielectric constant value in comparison to SiOC. This allows for increased adhesion and a possible reduction in the amount of delamination problems that can occur. Of course, there can be other variations, modifications, and alternatives.

An exemplary gas flow ratio of 10:5:3 of $3MS:SiF_4:O_2$ can be utilized to form the layer of SiOCF as low dielectric constant layer 234. One or more precursors can be introduced into the processing environment with the precursors being deposited on the surface region of the substrate. For example, the precursors may be one of DMDMOS, 3MS, TOMCAT, $O_2$, $N_2O$, $H_2O_2$, or OMCAT. At least one of the precursors includes fluorine. A plasma can be formed within the processing chamber to cause a chemical reaction in the precursor located on the surface region of the substrate. Of course, there can be other variations, modifications, and alternatives.

Figure 9C:
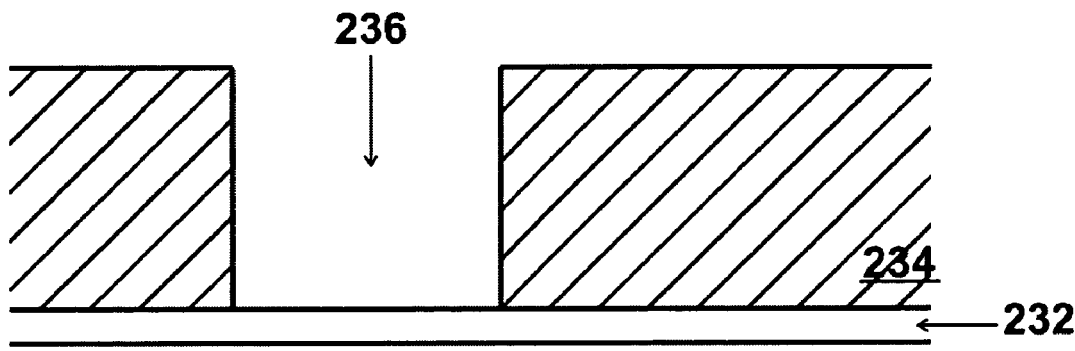

In process 206, one or more trenches 236 is formed within the low dielectric constant layer 234, as shown in FIG. 9C and structure 218. The number and formation of trenches 236 may be dependent upon the specific device being manufactured or on the specific processes being employed. For example, trench 236 may extend into surface region 232. Additionally, a dual or single damascene trench could be created in process 206 that extends through one or more dielectric layers, such as low dielectric constant layer 234. Of course, there can be other variations, modifications, and alternatives.

Figure 9D:
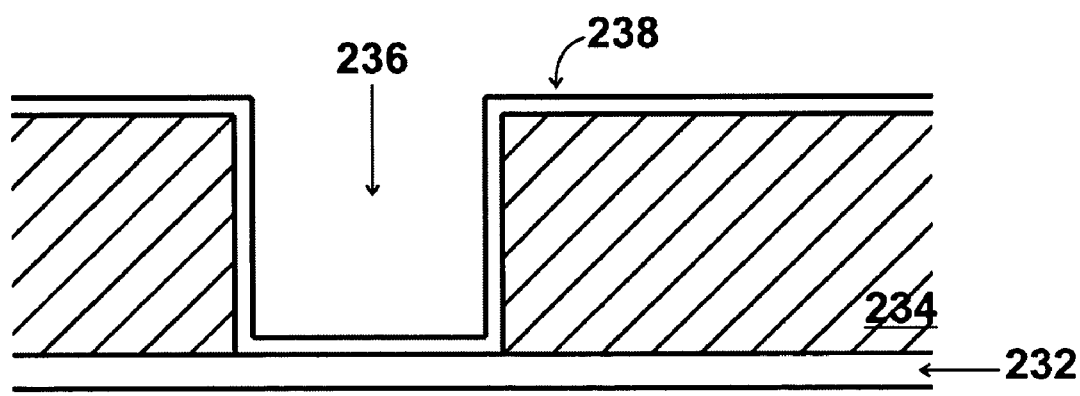

In process 208, a diffusion barrier layer 238 is deposited overlying low dielectric constant layer 234 as shown in FIG. 9D and structure 220. Diffusion barrier layer 238 overlies the exposed regions of low dielectric constant layer 234 and lines the sidewalls and bottom of trench 236, if a trench was formed previously in process 206. Diffusion barrier layer 238 is used to prevent the diffusion of copper ions in copper layer 22 from diffusing into low dielectric constant layer 234 and affecting its electrical properties. For example, diffusion barrier layer 238 may comprise silicon carbide, silicon nitride, titanium nitride, tungsten-carbon-nitride, aluminum nitride, tantalum nitride, or other suitable barrier materials. Of course, there can be other variations, modifications, and alternatives.

Figure 9E:
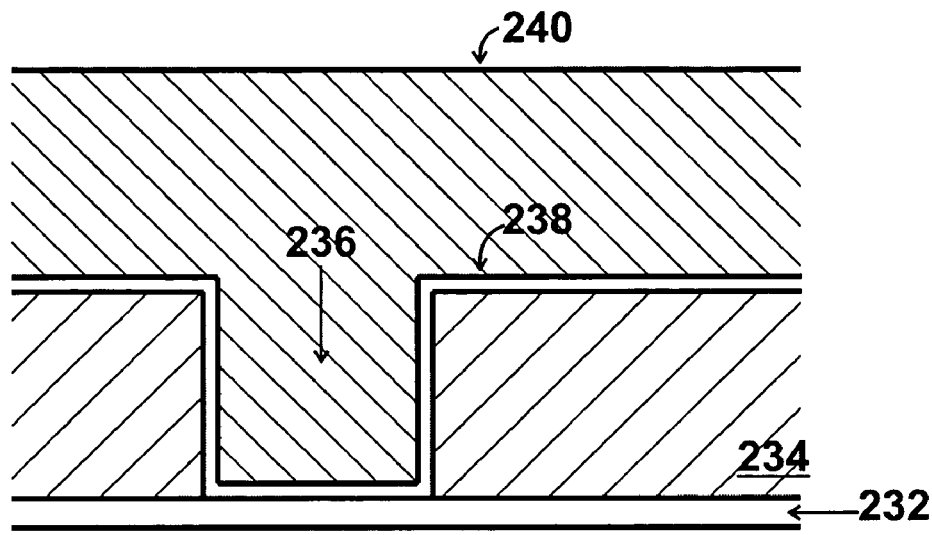

In process 210, a conductive layer 240 is formed overlying diffusion barrier layer 238 in structure 222, as shown in FIG. 9E. For example, the conductive layer 240 may be a metallic material such as copper or aluminum or any material that exhibits a high electric conductivity. Conductive layer 240 overlies diffusion barrier layer 238, filling in the remainder of trench 236. The conductive layer may be formed by a seed/ECP (electrochemical plating) process, whereby a pure seed layer is initially deposited and the bulk material grown from the seed layer using the ECP process. Of course, there can be other variations, modifications, and alternatives.

Figure 9F:
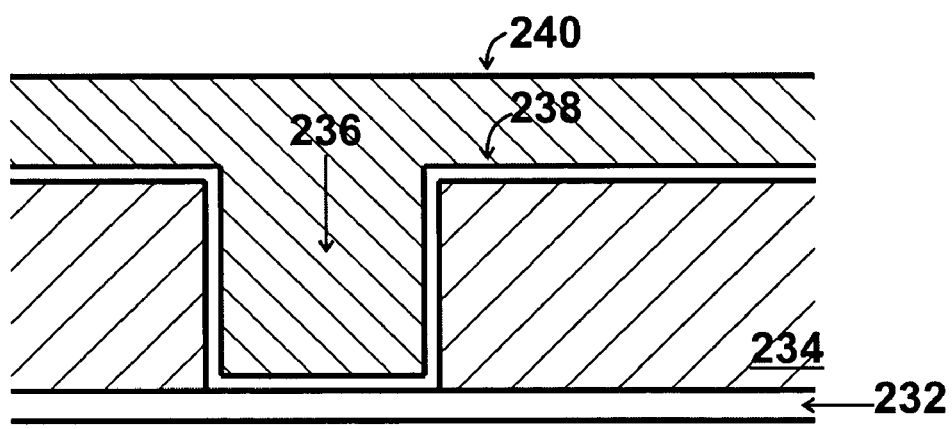

In process 212, the thickness of conductive layer 240 is reduced using a chemical-mechanical polishing process, as shown in FIG. 9F and structure 224. For example, the thickness of conductive layer 240 formed in process 210 may be greater than the desired thickness due to limited process controls during the ECP process. As a result, the thickness of conductive layer 240 may be reduced using a CMP process to the desired thickness. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a semiconductor device comprising:

providing a semiconductor substrate with a surface region, the surface region including one or more layers overlying the semiconductor substrate;

depositing a SiOCF layer overlying the surface region, the SiOCF layer being a low-dielectric constant layer having an improved mechanical strength;

forming a diffusion barrier layer overlying the dielectric layer;

forming a conductive layer overlying the diffusion barrier layer; and reducing the thickness of the conductive layer using a chemical-mechanical polishing process, wherein the SiOCF layer being formed by a CVD process that utilizes fluorine as a reactant such that the SiOCF layer has a breakdown voltage higher than a breakdown voltage of a dielectric layer that is formed without fluorine and a leakage current lower than a leakage current of the dielectric layer, the SiOCF layer being associated with a dielectric constant equal or less than 3.3, and a modulus value of about 21 GPa.

2. The method of claim 1 wherein the depositing the SiOCF layer overlying the surface region is performed using a PECVD process.

3. The method of claim 1 wherein the depositing the SiOCF layer overlying the surface region is performed at a temperature between and inclusive of 300 and 400 degrees C.

4. The method of claim 3 wherein the depositing the SiOCF layer overlying the surface region is performed at a pressure between and inclusive of 1 and 10 Torr.

5. The method of claim 4 wherein the depositing the SiOCF layer overlying the surface region is performed at a RF power between and inclusive of 20 to 500 W.

6. The method of claim 1 further comprising:
forming a trench in the SiOCF layer and/or surface region.

7. The method of claim 6 wherein the trench is formed by a single or dual damascene process.

8. The method of claim 1 wherein the conductive layer is a copper layer.

9. The method of claim 1 wherein fluorine is introduced by providing $SiF_4$ during the depositing the SiOCF layer overlying the surface region.

10. The method of claim 1 wherein the depositing the SiOCF layer overlying the surface region is performed using precursors selected from a group consisting of: DMDMOS, 3MS, TOMCAT, $O_2$, $N_2O$, $H_2O_2$, or OMCAT.

11. The method of claim 1 wherein the depositing the SiOCF layer overlying the surface region is performed with a gas flow ratio of 10:5:3 for $3MS:SiF_4:O_2$.

* * * * *